(12) United States Patent
Saji et al.

(10) Patent No.: US 11,456,712 B2
(45) Date of Patent: Sep. 27, 2022

(54) POWER AMPLIFIER DEVICE

(71) Applicant: Nuvoton Technology Corporation Japan, Kyoto (JP)

(72) Inventors: Takashi Saji, Shiga (JP); Kaname Motoyoshi, Hyogo (JP); Shingo Matsuda, Kyoto (JP)

(73) Assignee: NUVOTON TECHNOLOGY CORPORATION JAPAN, Kyoto (JP)

( * ) Notice: Subject to any disclaimer, the term of this patent is extended or adjusted under 35 U.S.C. 154(b) by 0 days.

(21) Appl. No.: 17/626,006

(22) PCT Filed: Apr. 9, 2021

(86) PCT No.: PCT/JP2021/015035
§ 371 (c)(1),
(2) Date: Jan. 10, 2022

(87) PCT Pub. No.: WO2021/220772
PCT Pub. Date: Nov. 4, 2021

(65) Prior Publication Data
US 2022/0209726 A1    Jun. 30, 2022

(30) Foreign Application Priority Data
Apr. 30, 2020    (JP) .............................. JP2020-080183

(51) Int. Cl.
*H03F 1/30*    (2006.01)
*H03F 3/21*    (2006.01)
(52) U.S. Cl.
CPC ...................................... *H03F 3/21* (2013.01)
(58) Field of Classification Search
CPC ................ H03F 1/30; H03F 3/20; H03G 3/30
(Continued)

(56) References Cited

U.S. PATENT DOCUMENTS

| 7,671,684 B2 * | 3/2010 | Honda | H03F 3/193 |
| | | | 330/296 |
| 8,963,643 B2 * | 2/2015 | Lautzenhiser | H03F 1/301 |
| | | | 330/296 |

(Continued)

FOREIGN PATENT DOCUMENTS

| JP | 2007-019631 A | 1/2007 |
| WO | 99/29037 A1 | 6/1999 |

OTHER PUBLICATIONS

International Search Report and Written Opinion issued in International Patent Application No. PCT/JP2021/015035, dated Jul. 6, 2021; with English translation.

*Primary Examiner* — Henry Choe
(74) *Attorney, Agent, or Firm* — McDermott Will & Emery LLP

(57) ABSTRACT

A power amplifier device includes: a first power supply terminal for inputting a first power supply voltage; a first transistor for power amplification that (i) includes a first gate to which a bias voltage is applied, and (ii) is supplied with power from the first power supply terminal; a second power supply terminal for inputting a second power supply voltage lower than the first power supply voltage; a second transistor for monitoring that (i) includes a second gate to which the bias voltage is applied, (ii) is supplied with power from the first power supply terminal or the second power supply terminal, and (iii) imitates an operation of the first transistor; and a bias circuit that is supplied with power from the second power supply terminal and generates and adjusts the bias voltage according to a drain current or a source current of the second transistor.

19 Claims, 12 Drawing Sheets

(58) Field of Classification Search
USPC .................................................. 330/296, 285
See application file for complete search history.

(56) References Cited

U.S. PATENT DOCUMENTS 9,705,465 B2 * 7/2017 Bodnar ..................... H03F 3/21
2009/0115526 A1 5/2009 Honda et al.

* cited by examiner

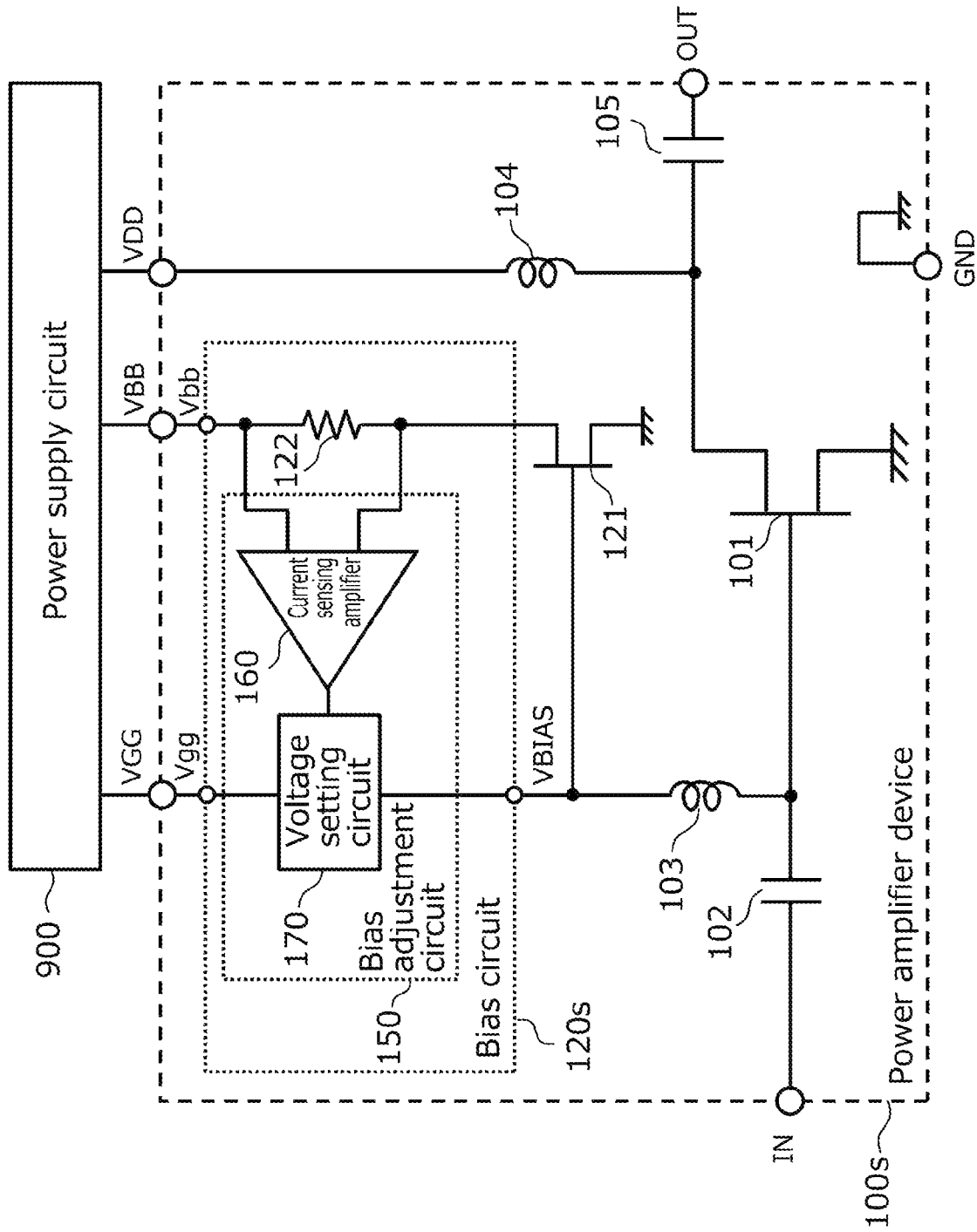

POWER AMPLIFIER DEVICE

CROSS-REFERENCE OF RELATED APPLICATIONS

This application is the U.S. National Phase under 35 U.S.C. § 371 of International Patent Application No. PCT/JP2021/015035, filed on Apr. 9, 2021, which in turn claims the benefit of Japanese Application No. 2020-080183, filed on Apr. 30, 2020, the entire disclosures of which Applications are incorporated by reference herein.

TECHNICAL FIELD

The present disclosure relates to power amplifiers and, for example, a power amplifier device including a bias circuit that adjusts a bias voltage.

BACKGROUND ART

Mobile phone base stations etc. of recent years have required high-power and high-efficiency power amplifier devices. High-electron mobility transistors (HEMTs) including a nitride semiconductor such as gallium nitride (GaN) or laterally-diffused metal-oxide semiconductor (LDMOS) transistors including a silicon-based semiconductor are capable of performing a high voltage operation and a high current density operation and are suitable for high-power power amplifier devices.

On the other hand, massive multiple-input and multiple-output (MIMO) that uses a large number of power amplifier devices and antenna devices in a high frequency band (e.g., 3 GHz or higher) has been examined to speed up signal transmission and reduce interference in signal transmission. Since a large number of power amplifier devices are installed for one base station, there has been a demand for downsizing of power amplifier devices and reduction of the number of required adjustments.

Regarding the downsizing of the power amplifier devices and the reduction of the number of the required adjustments, Patent Literature (PTL) 1 discloses a bias circuit that monitors a drain current of a transistor for power amplification and adjusts a bias voltage.

CITATION LIST

Patent Literature

[PTL 1] Japanese Unexamined Patent Application Publication No. 2007-19631

SUMMARY OF INVENTION

Technical Problem

According to the technique as disclosed by PTL 1, however, when a transistor for power amplification such as an HEMT or an LDMOS transistor is operated at a high voltage, the high voltage is also applied to a bias circuit. As a result, the bias circuit consumes a larger amount of power. Moreover, the bias circuit need include a high-withstand-voltage element, and the costs are a big challenge.

In view of this, the present disclosure has an object to provide a power amplifier device that solves the above problems, reduces power consumption, and cuts costs.

Solution to Problem

In order to achieve the above object, a power amplifier device according to one aspect of the present disclosure includes: a first power supply terminal for inputting a first power supply voltage; a first transistor for power amplification that (i) includes a first gate to which a bias voltage is applied, and (ii) is supplied with power from the first power supply terminal; a second power supply terminal for inputting a second power supply voltage lower than the first power supply voltage; a second transistor for monitoring that (i) includes a second gate to which the bias voltage is applied, (ii) is supplied with power from the first power supply terminal or the second power supply terminal, and (iii) imitates an operation of the first transistor; and a bias circuit that is supplied with power from the second power supply terminal and generates and adjusts the bias voltage according to a drain current or a source current of the second transistor.

Advantageous Effects of Invention

The power amplifier device according to the present disclosure is capable of reducing power consumption and cutting costs.

BRIEF DESCRIPTION OF DRAWINGS

FIG. 1B is a circuit diagram illustrating another configuration example of a power amplifier system including a power amplifier device according to Embodiment 1.

DESCRIPTION OF EMBODIMENTS

Hereinafter, power amplifier devices of the present disclosure will be described with reference to the drawings. However, detailed description may be omitted. For example, detailed description of well-known matter and overlapping description of identical elements may be omitted. Moreover, the respective figures are not necessarily precise illustrations. These are to avoid making the subsequent description verbose, and thus facilitate understanding by a person skilled in the art.

It should be noted that each of embodiments described below shows one specific example of the present disclosure. The numerical values, shapes, materials, constituent elements, the arrangement and connection of the constituent elements, etc. shown in the following embodiments are mere examples, are designed to help a person skilled in the art to sufficiently understand the present disclosure, and are not intended to limit the subject matter of the claims.

Embodiment 1

Hereinafter, power amplifier systems each including a power amplifier device according to Embodiment 1 will be specifically described with reference to FIG. 1A to FIG. 4.

Figure 1A:
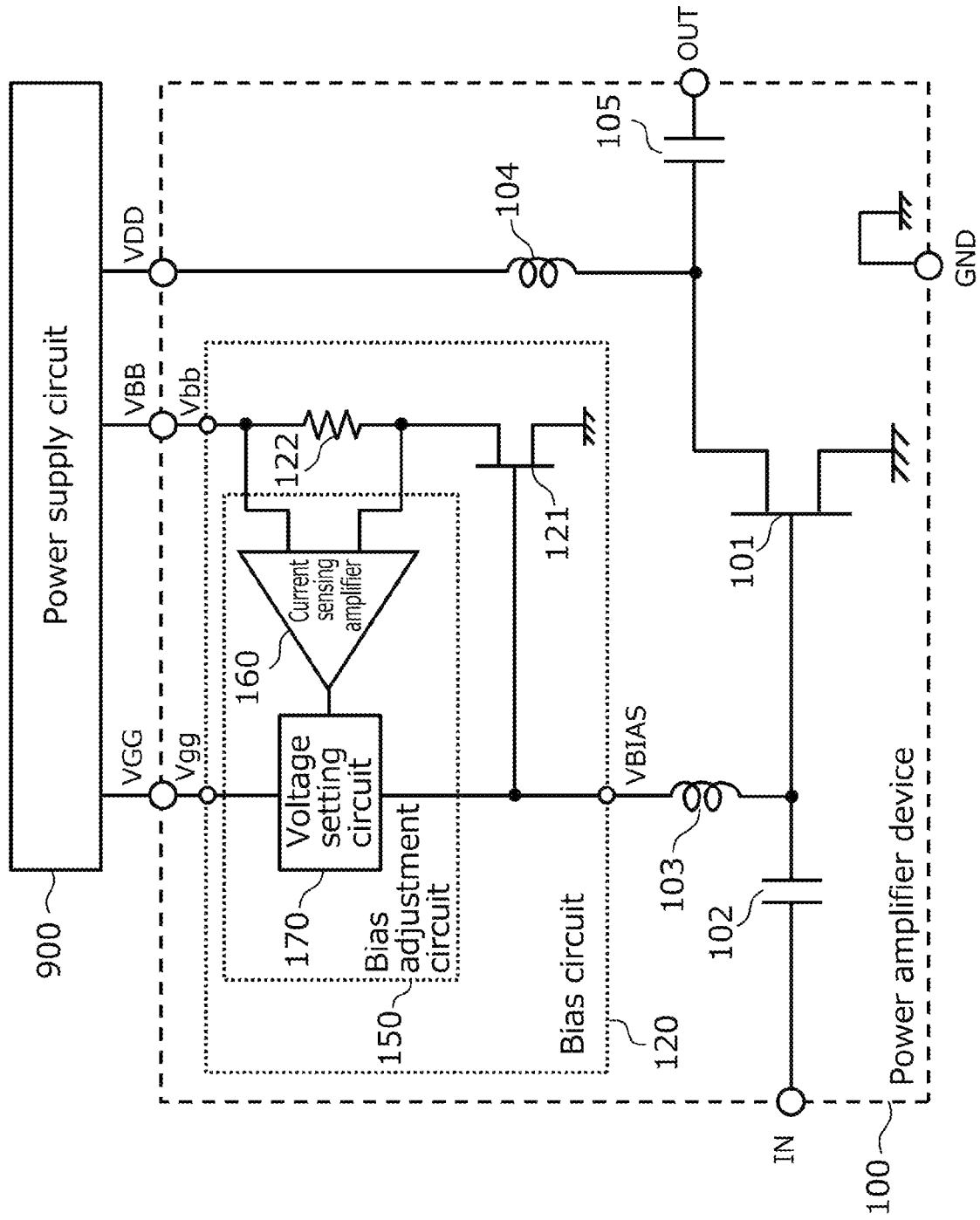
FIG. 1A is a circuit diagram illustrating one configuration example of a power amplifier system including a power amplifier device according to Embodiment 1.

FIG. 1A is a circuit diagram illustrating one configuration example of a power amplifier system including a power amplifier device according to Embodiment 1.

In FIG. 1A, the power amplifier system includes: power amplifier device 100 that amplifies radio-frequency (RF) input signals into RF output signals; and power supply circuit 900 that supplies power to power amplifier device 100. The power amplifier system is used for, for example, mobile phone base stations or satellite communication base stations. It should be noted that the power amplifier system is not limited to the base stations, and may be used for, for example, radar transmitters, wireless power transmitters, microwave ovens, and microwave heating devices.

Power amplifier device 100 includes, as external input-output terminals, an IN terminal, an OUT terminal, a VDD terminal, a VBB terminal, a VGG terminal, and a GND terminal. In addition, power amplifier device 100 includes, for example, first transistor 101 for power amplification, bias circuit 120, capacitors 102 and 105, and inductors 103 and 104.

The IN terminal is a terminal that is connected to the gate of first transistor 101 via capacitor 102 and to which RF input signals are inputted.

The OUT terminal is a terminal that is connected to the drain of first transistor 101 via capacitor 105 and from which RF output signals are outputted.

The VDD terminal is a terminal that is connected to the drain of first transistor 101 via inductor 104 and is for inputting first power supply voltage VDD. Specifically, the VDD terminal is a terminal for supplying power to first transistor 101 from power supply circuit 900 using first power supply voltage VDD. Moreover, the VDD terminal is also referred to as a first power supply terminal.

The VBB terminal is a terminal for inputting second power supply voltage VBB lower than first power supply voltage VDD. Specifically, the VBB terminal is a terminal for supplying power to bias circuit 120 from power supply circuit 900 using second power supply voltage VBB. Moreover, the VBB terminal is also referred to as a second power supply terminal.

The VGG terminal is a terminal for inputting third power supply voltage VGG for generating bias voltage. Specifically, the VGG terminal is a terminal for supplying power to bias circuit 120 from power supply circuit 900 using third power supply voltage VGG. Third power supply voltage VGG is used for generating bias voltage VBIAS. Moreover, the VGG terminal is also referred to as a third power supply terminal.

The GND terminal is a terminal for grounding a GND line or a GND wiring layer that is a reference potential inside power amplifier device 100.

It should be noted that although the terminals such as the VDD terminal and the VGG terminal differ in form depending on a mounting form of the power amplifier device, examples of the terminals include a lead pin, a leadless pin, a wire-bonding pad, a solder ball pad, and a connector.

First transistor 101 amplifies RF input signals inputted from the IN terminal via capacitor 102, and outputs RF output signals to the OUT terminal via capacitor 105. First transistor 101 has the gate to which bias voltage VBIAS is applied from bias adjustment circuit 150 via inductor 103 to be gate-biased. First transistor 101 has the drain to which first power supply voltage VDD is applied from power supply circuit 900 via inductor 104. First transistor 101 has the source that is grounded. It should be noted that the source, drain, and gate of first transistor 101 can be referred to as a first source, a first drain, and a first gate, respectively. In addition, a source current, a drain current, and a gate current of first transistor 101 can be referred to as a first source current, a first drain current, and a first gate current, respectively.

Bias circuit 120 is supplied with power from the second power supply terminal, and generates and adjusts bias voltage VBIAS according to a drain current or a source current of second transistor 121. For this reason, bias circuit 120 includes, a Vbb terminal, a Vgg terminal, and a VBIAS terminal as input-output terminals. The Vbb terminal is connected to the second power supply terminal, that is, the VBB terminal. The Vgg terminal is connected to the third power supply terminal, that is, the VGG terminal. The VBIAS terminal is connected to inductor 103. Bias circuit 120 includes, for example, second transistor 121, current sensing resistor 122, and bias adjustment circuit 150.

Second transistor 121 is a transistor for monitoring that imitates operations of first transistor 101. The operations imitated by second transistor 121 are mainly operations of first transistor 101 relating to direct current behavior. For this reason, bias voltage VBIAS is applied to the gate of second transistor 121 from bias adjustment circuit 150. Second transistor 121 has the source that is grounded. In other words, a gate voltage of second transistor 121 is biased with bias voltage VBIAS that is the same direct-current voltage as first transistor 101. It should be noted that the source, drain, and gate of second transistor 121 can be referred to as a second source, a second drain, and a second gate, respectively. In addition, a source current, a drain current, and a gate current of second transistor 121 can be referred to as a second source current, a second drain current, and a second gate current, respectively. As an imitation of an operation of first transistor 101, second transistor 121 causes a second drain current corresponding to a first drain current to flow through the second drain. It should be noted that the expression "a second drain current corresponding to a first drain current" means that a second drain is substantially proportional to a first drain current, and need not be completely proportional to the same.

Current sensing resistor 122 is a resistor for sensing a drain current of second transistor 121, and is, for example, a high-precision resistor having a small manufacturing variation in resistance value and a small temperature fluctuation. Current sensing resistor 122 has one of two terminals that is connected to the drain of second transistor 121, and the other of the two terminals that is connected to the Vbb terminal.

Bias adjustment circuit 150 includes current sensing amplifier 160 connected to the both ends of current sensing resistor 122, voltage setting circuit 170 connected to the Vgg terminal and inductor 103, etc. Current sensing amplifier 160 amplifies a voltage between the both ends of current sensing resistor 122, and outputs drain current information of second transistor 121 to voltage setting circuit 170. For example, drain current information is a current value or a voltage value substantially proportional to a drain current of second transistor 121.

Voltage setting circuit 170 sets and adjusts bias voltage VBIAS, based on the drain current information of second transistor 121.

Power supply circuit 900 generates and supplies first power supply voltage VDD, second power supply voltage VBB, and third power supply voltage VGG to power amplifier device 100.

It should be noted that second transistor 121 may be disposed outside bias circuit 120 in FIG. 1A. FIG. 1B shows a configuration example of this case. Power amplifier device 100s shown by FIG. 1B differs from power amplifier device 100 shown by FIG. 1A in that second transistor 121 is disposed not inside but outside bias circuit 120s. These power amplifier devices are identical except for this difference.

Next, a configuration example of bias circuit 120 will be described.

Figure 2:
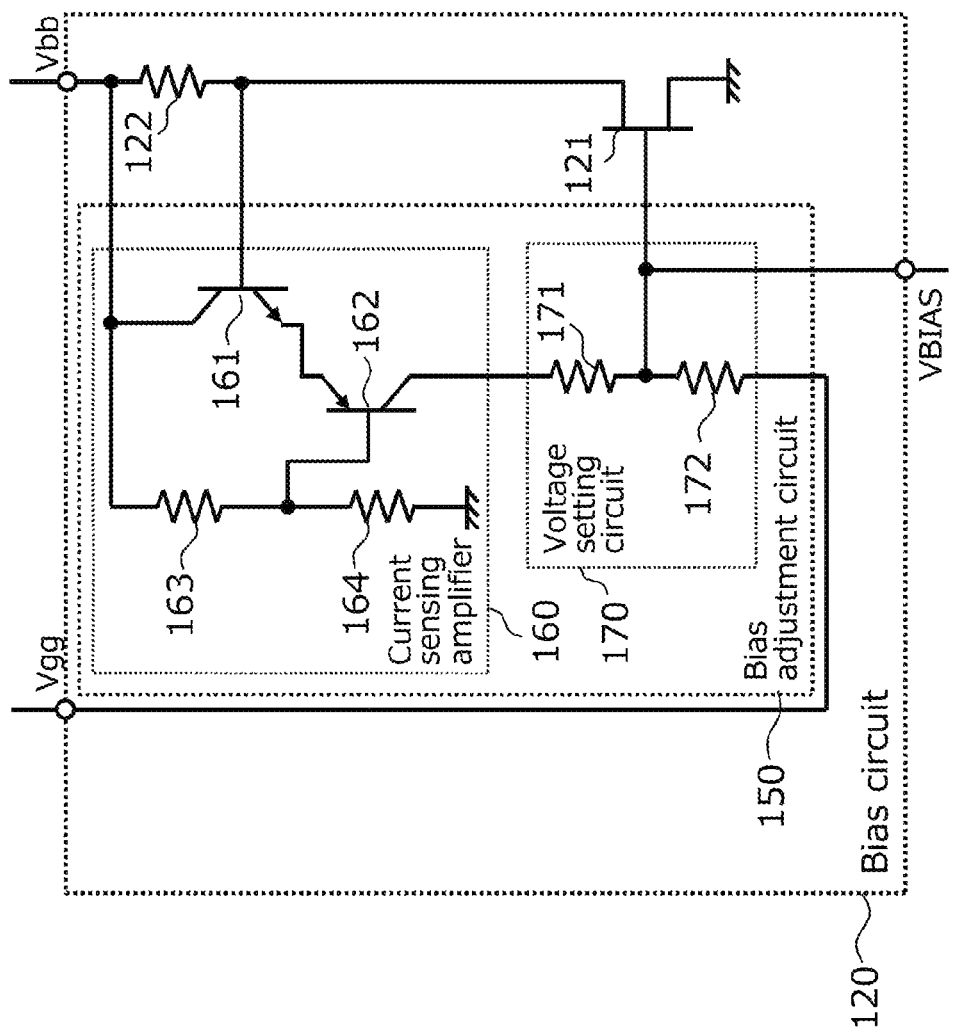
FIG. 2 is a circuit diagram illustrating one configuration of a bias circuit according to Embodiment 1.

FIG. 2 is a circuit diagram illustrating one configuration of bias circuit 120 according to Embodiment 1. In particular, the figure is a circuit diagram illustrating one example of detailed configurations of current sensing amplifier 160 and voltage setting circuit 170 shown by FIG. 1A.

Current sensing amplifier 160 includes NPN transistor 161, PNP transistor 162, resistors 163 and 164, etc. PNP transistor 162 has the base to which reference voltage Vref obtained by resistors 163 and 164 resistively dividing second power supply voltage VBB from the Vbb terminal is inputted. PNP transistor 162 has the emitter to which an emitter voltage of NPN transistor 161 is inputted. Since a voltage obtained by subtracting the amount of voltage drop by current sensing resistor 122 from second power supply voltage VBB is applied to the base of NPN transistor 161, an emitter voltage and a collector current of PNP transistor 162 decrease with a decrease in voltage drop by current sensing resistor 122. To put it another way, the collector current of PNP transistor 162 decreases with an increase in drain current of second transistor 121. A collector current of PNP transistor 162 is one example of the above-described drain current information.

Voltage setting circuit 170 includes resistors 171 and 172 etc. Resistor 171 is connected to the collector of PNP transistor 162 and resistor 172. Resistor 172 has one of two terminals that is connected to the Vgg terminal, and the other of the two terminals that is connected to resistor 171. The connecting point between resistors 171 and 172 is connected to the gate of second transistor 121. Resistors 171 and 172 performs current-to-voltage conversion on the collector current of PNP transistor 162 to generate bias voltage VBIAS. Bias voltage VBIAS decreases with a decrease in collector current of PNP transistor 162. The decrease in bias voltage VBIAS leads to a decrease in drain current of second transistor 121. When the drain current of second transistor 121 decreases to be less than a predetermined current value, bias voltage VBIAS rises.

As stated above, bias adjustment circuit 150 including current sensing amplifier 160 and voltage setting circuit 170, and current sensing resistor 122 constitute a feedback control circuit that adjusts a drain current of second transistor 121 to a predetermined current value.

Next, a configuration example of power amplifier device 100 including a semiconductor substrate will be described.

Figure 3:
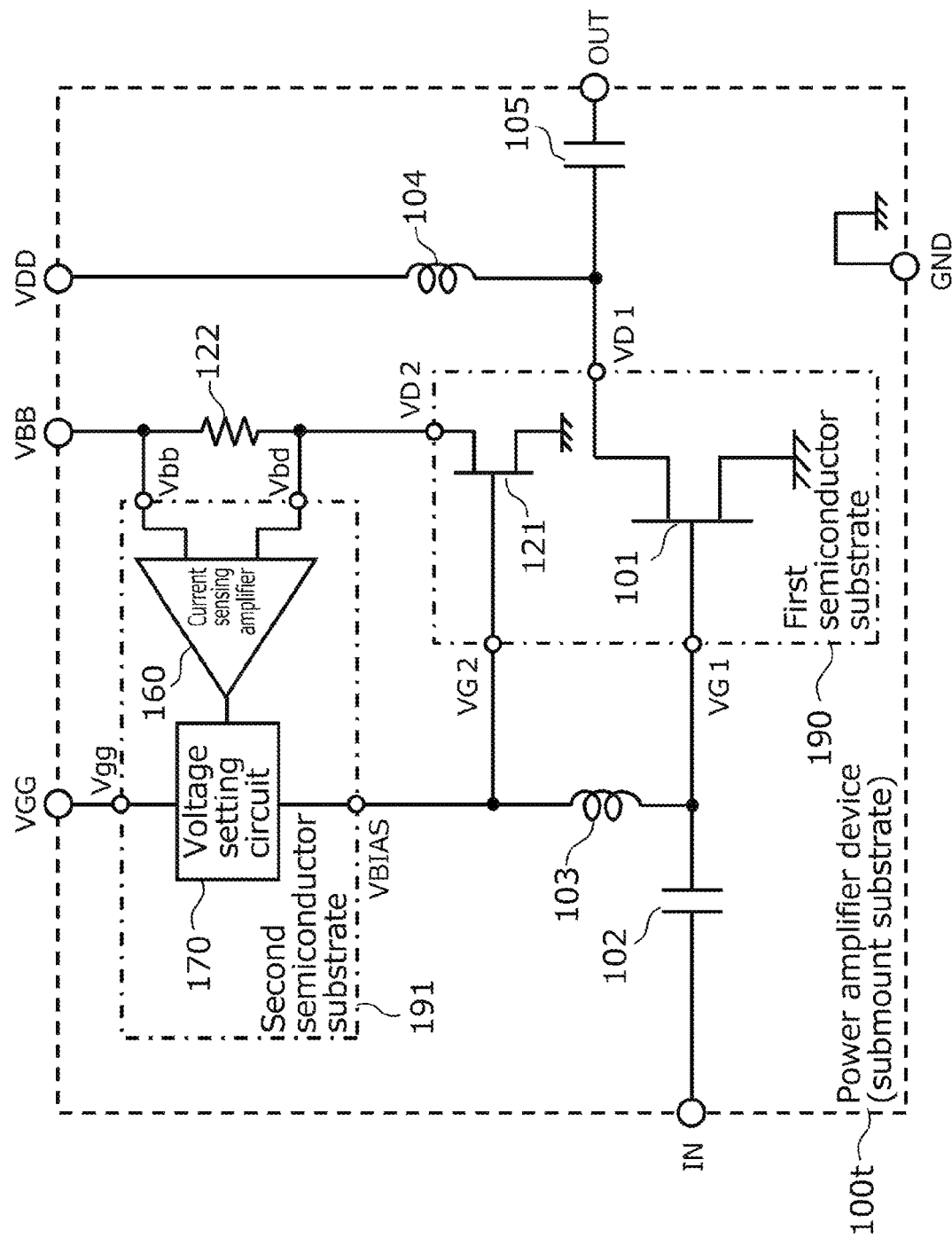
FIG. 3 is a circuit diagram illustrating one configuration of a power amplifier device according to Embodiment 1.

FIG. 3 is a circuit diagram illustrating power amplifier device 100t as one configuration of power amplifier device 100 according to Embodiment 1. In particular, the figure is a circuit diagram illustrating a configuration when portions of power amplifier device 100 shown by FIG. 1A are disposed on two semiconductor substrates.

Power amplifier device 100t includes first semiconductor substrate 190 and second semiconductor substrate 191. Some of the constituent elements of bias circuit 120 shown by FIG. 1A are separately disposed on first semiconductor substrate 190 and second semiconductor substrate 191. Moreover, first semiconductor substrate 190 and second semiconductor substrate 191, together with current sensing resistor 122, capacitors 102 and 105, and inductors 103 and 104, are mounted on a submount substrate such as multilayer resin substrate to form power amplifier device 100t. In other words, power amplifier device 100t may be configured as a submount substrate.

First semiconductor substrate 190 is, for example, a gallium nitride (GaN) semiconductor substrate disposed on a silicon (Si) substrate or a silicon carbide (SiC) substrate etc., and includes a VG1 terminal, a VG2 terminal, a VD1 terminal, and a VD2 terminal. First transistor 101 and second transistor 121 are disposed on first semiconductor substrate 190. First transistor 101 and second transistor 121 are each a normally-on transistor of HEMT type. First transistor 101 has, for example, gate width Wg1 of 3 mm. Second transistor 121 has, for example, gate width Wg2 of 0.4 mm. Second transistor 121 differs from first transistor 101 in gate width, but has the same device architecture as first transistor 101. First transistor 101 has the gate to which bias voltage VBIAS is applied via inductor 103 and the VG1 terminal to be gate-biased, and amplifies RF input signals inputted from the IN terminal. First transistor 101 has the drain to which first power supply voltage VDD is applied via inductor 104 and the VD1 terminal, and outputs, to the OUT terminal, output signals obtained by amplifying the RF input signals. Second transistor 121 has the gate to which bias voltage VBIAS is applied via the VG2 terminal. Second transistor 121 has the drain to which second power supply voltage VBB is applied via current sensing resistor 122 and the VD2 terminal. Since first transistor 101 and second transistor 121 are subjected to the same change in temperature on first semiconductor substrate 190, second transistor 121 can more accurately monitor a variation in characteristics of first transistor 101 due to the change in temperature. For example, it is possible to more accurately reflect a variation in first drain current due to a change in temperature in a second drain current.

Second semiconductor substrate 191 is, for example, a gallium arsenide (GaAs) semiconductor substrate and includes a Vbb terminal, a Vbd terminal, a Vgg terminal, and a VBIAS terminal. Current sensing amplifier 160 and voltage setting circuit 170 are disposed on second semiconductor substrate 191, and this configuration is equivalent to bias adjustment circuit 150 shown by FIG. 1A. A voltage between the both ends of current sensing resistor 122 is inputted to current sensing amplifier 160 via the Vbb terminal and the Vbd terminal, and current sensing amplifier 160 outputs drain current information of second transistor 121 to voltage setting circuit 170. Voltage setting circuit 170 adjusts bias voltage VBIAS, based on the drain current information of second transistor 121, and outputs adjusted bias voltage VBIAS via the VBIAS terminal.

The following describes operations of power amplifier device 100 thus configured according to Embodiment 1. First transistor 101 for power amplification amplifies RF input signals inputted to the gate of first transistor 101 from the IN terminal, and outputs RF output signals to the OUT terminal connected to the drain of first transistor 101. Bias circuit 120 applies bias voltage VBIAS to the gate of first transistor 101 so that first transistor 101 performs class AB operation. Bias voltage VBIAS is, for example, approximately −2.5 V. Power supply circuit 900 applies first power supply voltage VDD to the drain of first transistor 101 to supply power for power amplification. First power supply voltage VDD is, for example, 40 V. It should be noted that due to capacitors 102 and 105 connected to the gate or the drain, radio-frequency signals pass from the IN terminal to the OUT terminal, but a direct current does not flow from the IN terminal to the OUT terminal. Moreover, due to inductors 103 and 104 connected to the gate or the drain, a direct current flows from bias circuit 120 or power supply circuit 900, but radio-frequency signals are not transmitted to bias circuit 120 or power supply circuit 900. Since no RF input signals from the IN terminal also flow into second transistor 121, second transistor 121 imitates not an operation of amplifying an RF input signal by first transistor 101 but a direct-current operation of first transistor 101. It should be noted that a means to block or reduce radio-frequency signals to bias circuit 120 or power supply circuit 900 and to pass a direct-current voltage and a direct current need not be inductor 103, and such a means may be, for example, a low-pass filter including a resistor, a capacitor, etc.

The following describes operations of bias circuit 120 in detail. Bias voltage VBIAS outputted from bias circuit 120 is set so that first transistor 101 performs class AB operation. Bias voltage VBIAS is set so that a drain current of first transistor 101 when an RF input signal is in a no-signal state, that is, idle current Idq1 has a predetermined value, for example, 75 mA (25 mA per gate width Wg=1 mm). Here, characteristics of first transistor 101, for example, threshold voltage and mutual conductance, vary due to a manufacturing variation or temperature dependency. When bias voltage VBIAS has a fixed voltage value, idle current Idq1 varies due to a variation in characteristics of first transistor 101. This causes the problem of varied power efficiency, power gain, linearity, etc., which are main characteristics of power amplifier device 100. For this reason, bias circuit 120 has a function of adjusting bias voltage VBIAS so that idle current Idq1 has a predetermined value even when the characteristics of first transistor 101 vary.

Power supply circuit 900 applies second power supply voltage VBB and third power supply voltage VGG to bias circuit 120. Second power supply voltage VBB is, for example, 5 V, and third power supply voltage VGG is, for example, −5 V. Second transistor 121 is gate-biased at bias voltage VBIAS in the same manner as first transistor 101, and drain current Idq2 flows as a second drain current through second transistor 121. Since inductor 103 does not input an RF input signal to second transistor 121, drain current Idq2 stays constant regardless of the RF input signal. Drain current Idq2 is substantially proportional to idle current Idq1 of first transistor 101 and is, for example, 10 mA. It should be noted that the term "substantially proportional" means that drain currents of first transistor 101 and second transistor 121 have a substantially proportional relationship because (i) first transistor 101 and second transistor 121 are semiconductor devices, and (ii) it is rare that even if the same drain voltage and gate voltage are applied to first transistor 101 and second transistor 121, drain currents of first transistor 101 and second transistor 121 have a complete proportional relationship. For this reason, detecting drain current Idq2 of second transistor 121 makes it possible to monitor idle current Idq1 of first transistor 101. Moreover, second transistor 121 has the same device architecture as first transistor 101, is disposed on same first semiconductor substrate 190 as first transistor 101, and is contained in one package so that second transistor 121 operates in conjunction with the variation in characteristics of first transistor 101 due to the manufacturing variation or the temperature dependency. It should be noted that first transistor 101 and second transistor 121 may be disposed on different semiconductor substrates. In this case, first transistor 101 and second transistor 121 may be contained in the same package and thermally coupled.

Figure 4:
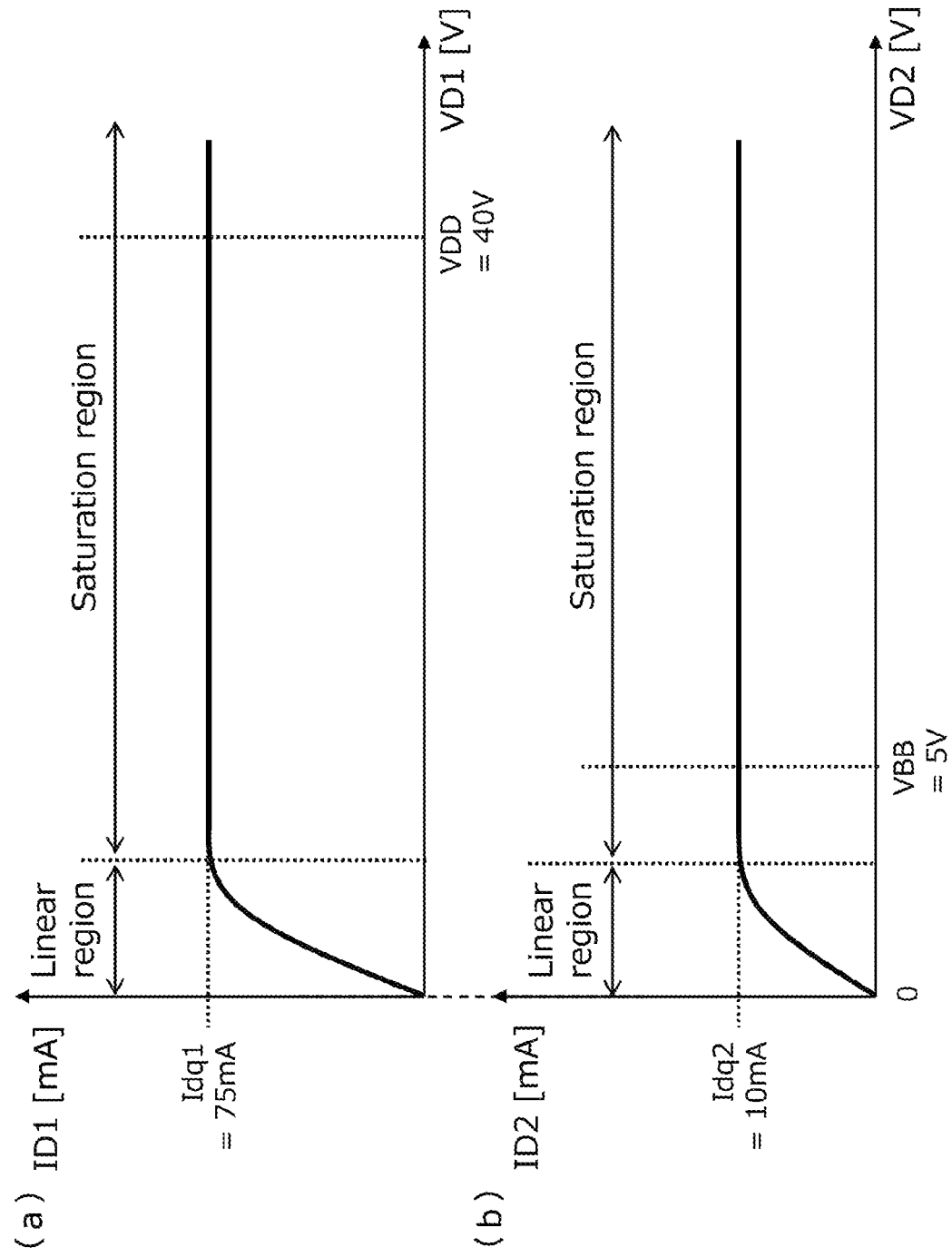
FIG. 4 is a diagram illustrating an example of setting a supply voltage by a power amplifier device according to Embodiment 1.

FIG. 4 is a diagram illustrating an example of setting a supply voltage by power amplifier device 100 according to Embodiment 1. More specifically, (a) in FIG. 4 is a characteristic diagram when predetermined bias voltage VBIAS is applied to the gate of first transistor 101, the characteristic diagram having the horizontal axis and the vertical axis representing drain voltage VD1 and drain current ID1 of first transistor 101, respectively. (b) in FIG. 4 is a characteristic diagram when predetermined bias voltage VBIAS is applied to the gate of second transistor 121, the characteristic diagram having the horizontal axis and the vertical axis representing drain voltage VD2 and drain current ID2 of second transistor 121, respectively.

First power supply voltage VDD is applied to the drain of first transistor 101. Then, as shown by (a) in FIG. 4, first transistor 101 operates in a saturation region, and idle current Idq1 flows in first transistor 101. (a) in FIG. 4 shows an example in which first power supply voltage VDD is 40 V, and idle current Idq1 is 75 mA.

In contrast, second power supply voltage VBB (=5 V) is applied to the drain of second transistor 121. Then, as shown by (b) in FIG. 4, second transistor 121 operates in a saturation region, and drain current Idq2 (=10 mA) flows in second transistor 121. (b) in FIG. 4 shows an example in which second power supply voltage VBB is 5 V, and drain current Idq2 is 10 mA.

When second transistor 121 also operates in the saturation region, a drain current ratio is a value close to a gate width ratio even if a supply voltage to the drain of first transistor 101 is significantly different from a supply voltage to the drain of second transistor 121. Accordingly, second power supply voltage VBB may be set so that second transistor 121 operates in the saturation region. It should be noted that even if second transistor 121 is made to operate in a linear region, there is no problem as long as a drain current ratio can be obtained with a desired accuracy. Furthermore, strictly speaking, the drain voltage of second transistor 121 is reduced to be lower than second power supply voltage VBB by voltage drop by current sensing resistor 122. For this reason, a resistance value of current sensing resistor 122 may be set low within an acceptable range of current sensing accuracy to reduce voltage drop.

Current sensing resistor 122 is a resistor for sensing drain current Idq2 of second transistor 121 and has, for example, a resistance of 100Ω. For example, when drain current Idq2 of 10 mA flows, a voltage between the both ends (detection voltage Vdetect) of current sensing resistor 122 is 1.0 V.

Current sensing amplifier 160 causes resistors 163 and 164 to resistively divide second power supply voltage VBB to generate reference voltage Vref. Resistors 163 and 164 have, for example, resistances of 3.4 kΩ and 1.6 kΩ, respectively, and reference voltage Vref is 1.6 V. NPN transistor 161 and PNP transistor 162 pass a collector current corresponding to detection voltage Vdetect and reference voltage Vref and output the collector current to voltage setting circuit 170.

Voltage setting circuit 170 causes resistors 171 and 172 to perform current-to-voltage conversion on the collector current of PNP transistor 162 to generate bias voltage VBIAS. Resistors 171 and 172 both have, for example, a resistance of 1 kΩ, and an intermediate potential between a collector voltage of PNP transistor 162 and third power supply voltage VGG is bias voltage VBIAS.

As stated above, when idle current Idq1 of first transistor 101 decreases due to, for example, a change in temperature, drain current Idq2 of second transistor 121 in a substantially proportional relationship with first transistor 101 decreases. A base voltage of NPN transistor 161 rises, and the collector current of PNP transistor 162 increases. Accordingly, bias voltage VBIAS rises, and drain current Idq2 of second transistor 121 increases. Idle current Idq1 of first transistor 101 in the substantially proportional relationship with second transistor 121 also increases. Consequently, bias circuit 120 is capable of operating to increase idle current Idq1 of first transistor 101 for power amplification when idle current Idq1 decreases to be less than a predetermined current value due to the manufacturing variation or the temperature dependency etc.

Contrary to the above description, when idle current Idq1 of first transistor 101 increases, a base voltage of NPN transistor 161 drops, and the collector current of PNP transistor 162 decreases. Accordingly, bias voltage VBIAS drops, and it is possible to decrease idle current Idq1 of first transistor 101. Consequently, bias circuit 120 is capable of controlling bias voltage VBIAS according to an increase or decrease in idle current Idq1 of first transistor 101 for power amplification, to keep idle current Idq1 constant.

As described above, the power amplifier device according to Embodiment 1 is capable of monitoring idle current Idq1 of first transistor 101 for power amplification and adjusting bias voltage VBIAS, to reduce a variation in idle current Idq1 due to the manufacturing variation or the temperature dependency and to perform a predetermined class operation. Moreover, whereas it is possible to improve power efficiency by applying, for example, 40 V to the drain of first transistor 101 to cause first transistor 101 to perform a high voltage operation, a supply voltage to be applied to bias circuit 120 is, for example, at most 5 V, and it is possible to reduce power consumption. Furthermore, bias circuit 120 can be formed of a low-withstand-voltage element except for second transistor 121, which can reduce manufacturing costs.

It should be noted that although first transistor 101 and second transistor 121 are each a transistor of HEMT type disposed on first semiconductor substrate 190, which is a gallium nitride (GaN) semiconductor substrate, in the present embodiment, first transistor 101 and second transistor 121 may be each an LDMOS transistor disposed on a silicon (Si) semiconductor substrate. It should be noted that when first transistor 101 and second transistor 121 are each a normally-off transistor, third power supply voltage VGG may be set to a ground level or a positive voltage.

It should be noted that although bias adjustment circuit 150 is disposed on second semiconductor substrate 191, which is a gallium arsenide (GaAs) semiconductor substrate, in the present embodiment, bias adjustment circuit 150 may be disposed on a silicon (Si) semiconductor substrate. Moreover, bias adjustment circuit 150 may be disposed on the same semiconductor substrate as second transistor 121. For example, first transistor 101 and second transistor 121 may each be a silicon LDMOS transistor that operates at a high voltage of at least 10 V, and bias adjustment circuit 150 may be a silicon complementary MOS (CMOS) circuit that operates at a low voltage of at most 10 V.

It should be noted that although current sensing resistor 122 is not disposed on second semiconductor substrate 191 because current sensing resistor 122 has a big influence on a variation in idle current Idq1 of first transistor 101 in the present embodiment, current sensing resistor 122 may be disposed on second semiconductor substrate 191. Current sensing resistor 122 may be disposed close to current sensing amplifier 160 to offset the temperature dependency of transistors etc. in current sensing amplifier 160. Moreover, current sensing resistor 122 may be disposed on first semiconductor substrate 190. By disposing current sensing resistor 122 close to first transistor 101 and changing a resistance value of current sensing resistor 122 dependent on a temperature of first transistor 101, idle current Idq1 of first transistor 101 may be caused to have temperature dependency. For example, by increasing the resistance value of current sensing resistor 122 as first transistor 101 has a higher temperature, it is possible to decrease idle current Idq1, improve power efficiency, and reduce heat generation. Furthermore, resistance adjustment may be made by laser trimming etc. in an inspection process etc. In addition, current sensing resistor 122 may be a variable resistor of which a user can adjust a resistance value.

Figure 5:
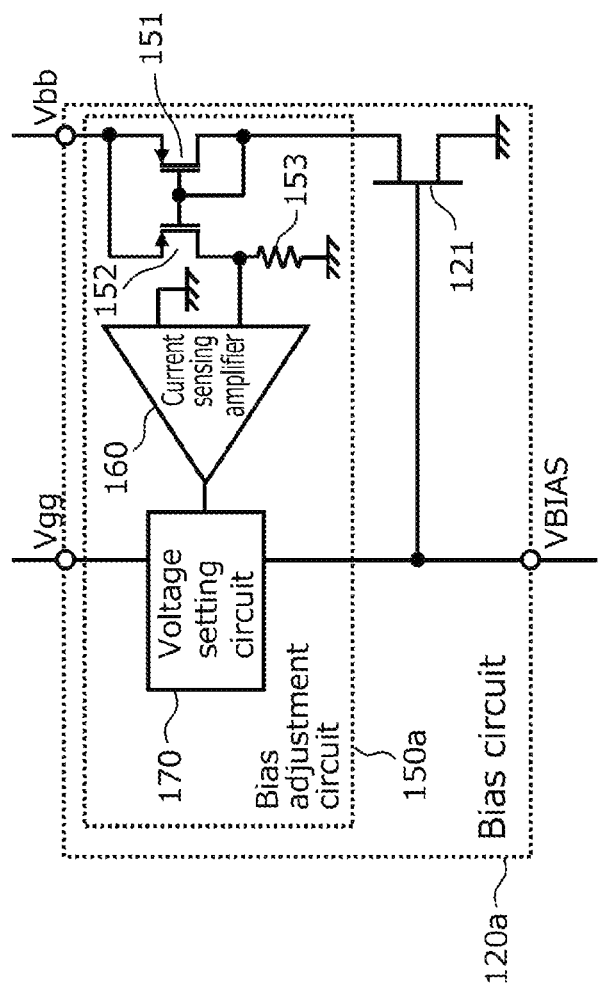
FIG. 5 is a circuit diagram illustrating a variation of a bias circuit according to Embodiment 1.

It should be noted that although bias circuit 120 that senses the drain current of second transistor 121 using current sensing resistor 122 has been described in the present embodiment, other current sensing methods may be used. For example, FIG. 5 shows, as a variation of bias circuit 120, bias circuit 120a including a current mirror circuit. Bias circuit 120a includes bias adjustment circuit 150a including a current mirror composed of p-type MOSFETs 151 and 152. The current mirror generates a current proportional to the drain current of second transistor 121, and current sensing resistor 153 performs current-to-voltage conversion. A voltage proportional to the drain current of second transistor 121 is inputted to current sensing amplifier 160, and the same advantageous effect as the present embodiment is produced.

It should be noted that although the configuration including NPN transistor 161 and PNP transistor 162 has been described as current sensing amplifier 160 in the present embodiment, the configuration may include an arithmetic circuit such as an operational amplifier.

It should be noted that power amplifier device 100 may contain a matching circuit for adjusting an impedance of the IN terminal or the OUT terminal to 50Ω etc. In addition, the matching circuit, together with capacitors 102 and 105, inductors 103 and 104, etc., may be disposed on first semiconductor substrate 190 on which first transistor 101 is disposed, or may be disposed on second semiconductor substrate 191 on which bias adjustment circuit 150 is disposed.

It should be noted that although the sources of first transistor 101 and second transistor 121 are grounded in the present embodiment, the sources may be grounded via a resistor or an inductor.

It should be noted that although the gate of first transistor 101 and the gate of second transistor 121 are connected via inductor 103 in the present embodiment, a resistor or an inductor may be further inserted between the gate of first transistor 101 and the gate of second transistor 121. Moreover, a capacitor may be inserted between the gate of second transistor 121 and the GND to stabilize a gate voltage. Furthermore, a level shift circuit etc. may shift and input bias voltage VBIAS to the gate of second transistor 121. The level shift circuit may add a resistor in voltage setting circuit 170 to make it possible to supply different bias voltages VBIAS to first transistor 101 and second transistor 121.

It should be noted that although first transistor 101 and second transistor 121 have the same device architecture in the present embodiment, first transistor 101 and second transistor 121 may each have a different device architecture. For example, first transistor 101 and second transistor 121 may differ in a gate structure such as a gate length.

It should be noted that although first power supply voltage VDD applied from power supply circuit 900 is kept at 40 V in the present embodiment, first power supply voltage VDD may vary. For example, like an envelope tracking amplifier device, first power supply voltage VDD may be varied by an RF input signal. In this case, second power supply voltage VBB may be a constant voltage or may be linked to first power supply voltage VDD.

As described above, power amplifier device 100 according to Embodiment 1 includes: a first power supply terminal for inputting first power supply voltage VDD; first transistor 101 for power amplification that (i) includes a first gate to which bias voltage VBIAS is applied, and (ii) is supplied with power from the first power supply terminal; a second power supply terminal for inputting second power supply voltage VBB lower than first power supply voltage VDD; second transistor 121 for monitoring that (i) includes a second gate to which bias voltage VBIAS is applied, (ii) is supplied with power from the first power supply terminal or the second power supply terminal, and (iii) imitates an operation of first transistor 101; and bias circuit 120 that is supplied with power from the second power supply terminal and generates and adjusts bias voltage VBIAS according to a drain current or a source current of second transistor 121.

With this configuration, it is possible to reduce the power consumption of bias circuit 120. In addition, it is possible to reduce costs because bias circuit 120 can be formed of a low-withstand-voltage, general-purpose, low-cost element.

Here, second transistor 121 may be supplied with the power from the second power supply terminal.

With this configuration, it is possible to further reduce the power consumption of second transistor 121.

Here, bias circuit 120 may generate and adjust bias voltage VBIAS according to the source current of second transistor 121.

With this configuration, it is possible to sense the source current as a lower voltage value than a voltage value of the drain current, cause bias circuit 120 to perform a lower voltage operation, and further reduce power consumption.

Moreover, power amplifier device 100 according to Embodiment 1 includes: a first power supply terminal for inputting first power supply voltage VDD; first transistor 101 for power amplification that includes a first drain supplied with power from the first power supply terminal, a first source that is grounded, and a first gate for inputting a radio-frequency signal; a second power supply terminal for inputting second power supply voltage VBB lower than first power supply voltage VDD; and bias circuit 120 that applies bias voltage VBIAS to first gate of first transistor 101. Bias circuit 120 includes: second transistor 121 for monitoring that (i) includes a second drain supplied with power from the second power supply terminal, a second source that is grounded, and a second gate electrically connected to the first gate, and (ii) causes a second drain current to flow through the second drain, the second drain current corresponding to a first drain current flowing through the first drain; and bias adjustment circuit 150 that is supplied with the power from the second power supply terminal and adjusts the bias voltage according to the second drain current.

With this configuration, it is possible to reduce the power consumption of bias circuit 120. In addition, it is possible to reduce costs because bias circuit 120 can be formed of a low-withstand-voltage, general-purpose, low-cost element.

Here, second power supply voltage VBB may be set to a voltage at which second transistor 121 operates in a saturation region.

With this configuration, by second transistor 121 operating in the saturation region in which drain voltage dependency of second transistor 121 is stable, it is possible to reduce differences in power supply voltage characteristics of first transistor 101 and second transistor 121.

Here, second transistor 121 may be contained in the same package as first transistor 101.

With this configuration, since first transistor 101 and second transistor 121 are subjected to the same change in temperature in the package, second transistor 121 can more accurately monitor a variation in characteristics of first transistor 101 due to the change in temperature.

Here, second transistor 121 may be disposed on same first semiconductor substrate 190 as first transistor 101.

With this configuration, since first transistor 101 and second transistor 121 are subjected to the same change in temperature on first semiconductor substrate 190, second transistor 121 can more accurately monitor a variation in characteristics of first transistor 101 due to the change in temperature.

Here, at least part of bias circuit 120 may be disposed on a different semiconductor substrate from second transistor 121.

With this configuration, since bias circuit 120 can be formed of, for example, low-cost second semiconductor substrate 191 that is different from first semiconductor substrate 190 including first transistor 101 and second transistor 121, it is possible to further reduce costs.

Here, power amplifier device 100 may include current sensing resistor 122 connected to the drain of second transistor 121; and a submount substrate on which the semiconductor substrate is mounted. Current sensing resistor 122 may be mounted on the submount substrate.

With this configuration, it is easy to use, as current sensing resistor 122, a resistance element more accurate in a variation or temperature characteristics than a resistor disposed on the semiconductor substrate. Moreover, by disposing current sensing resistor 122 outside the semiconductor substrate, it is possible to easily adjust a second drain current value at a manufacturing stage in which the semiconductor substrate is mounted on the submount substrate. Even when current sensing resistor 122 is disposed outside the semiconductor substrate, the number of the terminals of first semiconductor substrate 190 including first transistor 101 and second transistor 121 or the number of the terminals of second semiconductor substrate 191 including current sensing amplifier 160 and voltage setting circuit 170 is not increased.

Here, first transistor 101 and second transistor 121 may each be a nitride semiconductor.

With this configuration, even if first transistor 101 and second transistor 121 are each a nitride semiconductor that performs a high frequency and high voltage operation, bias circuit 120 can be manufactured using low-withstand-voltage, general-purpose circuit components.

Here, first transistor 101 and second transistor 121 may each be an LDMOS transistor.

With this configuration, even if first transistor 101 and second transistor 121 are each an LDMOS transistor that performs a high frequency and high voltage operation, bias circuit 120 can be manufactured using low-withstand-voltage, general-purpose circuit components.

Embodiment 2

Next, a power amplifier system including a power amplifier device according to Embodiment 2 will be described with reference to FIG. 6 and FIG. 7.

Embodiment 2 describes a power amplifier device having an enable function. It should be noted that description overlapping Embodiment 1 will be omitted.

Figure 6:
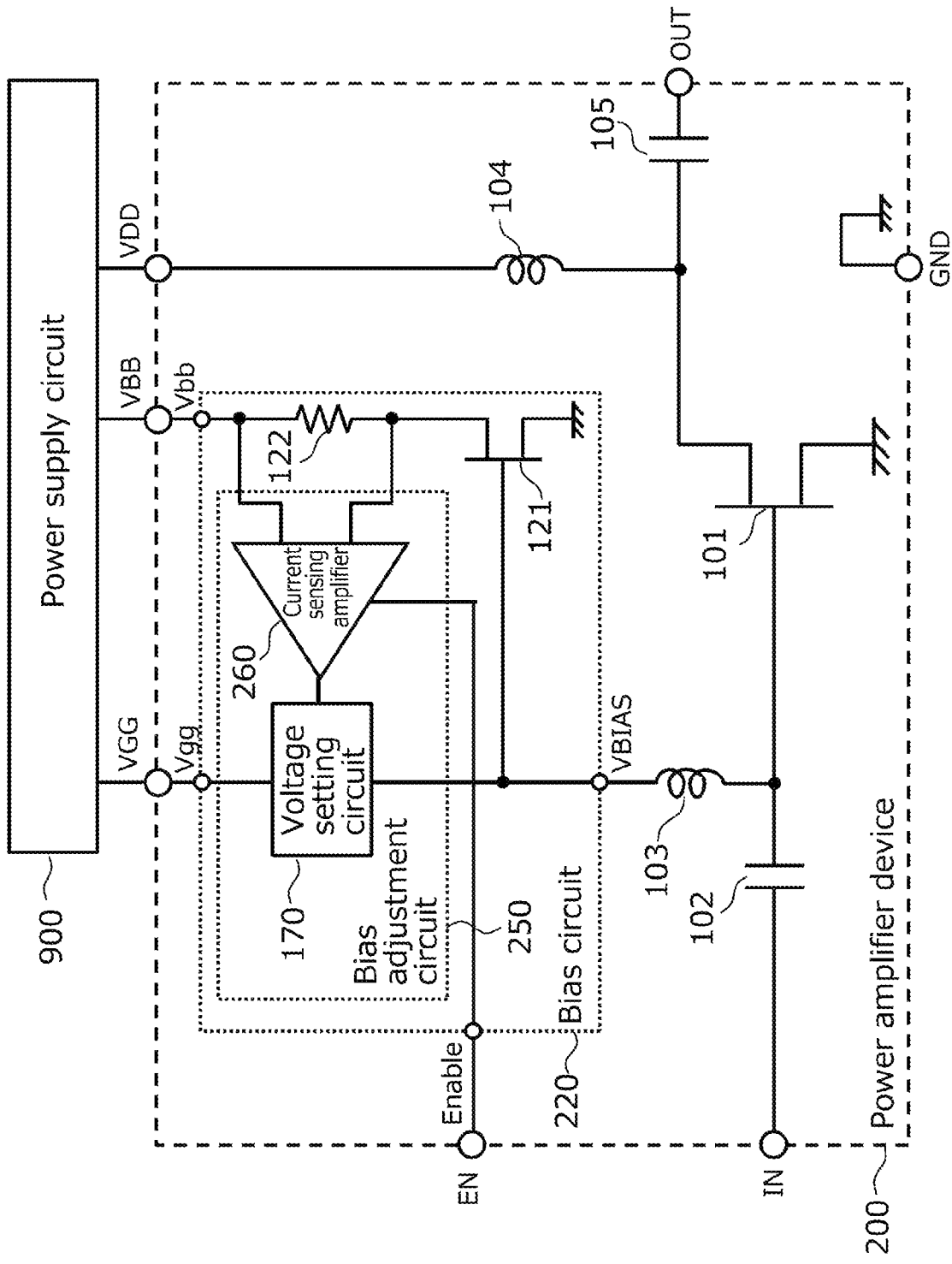
FIG. 6 is a circuit diagram illustrating one configuration example of a power amplifier system including a power amplifier device according to Embodiment 2.

FIG. 6 is a circuit diagram illustrating one configuration example of a power amplifier system including a power amplifier device according to Embodiment 2. The power amplifier system shown by FIG. 6 differs from the power amplifier system shown by FIG. 1A including the power amplifier device according to Embodiment 1 in including power amplifier device 200 instead of power amplifier device 100. The following mainly describes the differences. Power amplifier device 200 differs from power amplifier device 100 shown by FIG. 1A in including bias circuit 220 instead of bias circuit 120 and in that an EN terminal is added as an enable control terminal for controlling an active state and an inactive state of a bias voltage. Bias circuit 220 includes bias adjustment circuit 250 comprising, for example, current sensing amplifier 260 connected to the EN terminal of power amplifier device 200 via the Enable terminal, and voltage setting circuit 170.

It should be noted that as with in FIG. 1B, second transistor 121 may be disposed outside bias circuit 220 in FIG. 6.

Figure 7:
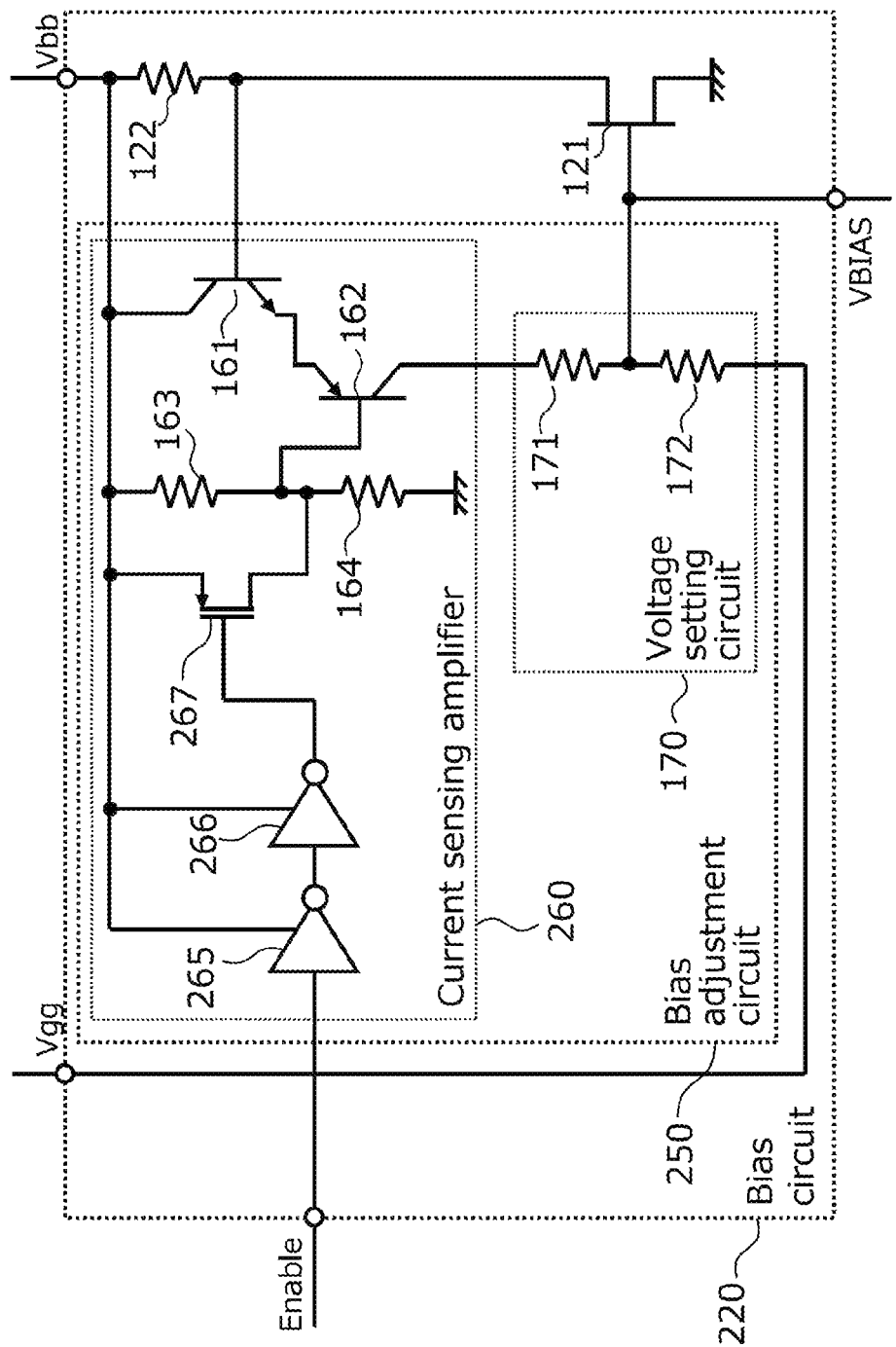
FIG. 7 is a circuit diagram illustrating one configuration of a bias circuit according to Embodiment 2.

FIG. 7 is a circuit diagram illustrating one configuration of bias circuit 220 of the power amplifier device according to Embodiment 2. Bias circuit 220 differs from bias circuit 120 according to Embodiment 1 shown by FIG. 2 in including an Enable terminal, inverter circuits 265 and 266, and p-type MOSFET 267. The Enable terminal is connected to the gate of p-type MOSFET 267 via inverter circuits 265 and 266. Second power supply voltage VBB is applied to the source of p-type MOSFET 267. The drain of p-type MOSFET 267 is connected to a connecting point between resistors 163 and 164 for generating reference voltage Vref.

The following describes operations of the power amplifier device thus configured according to Embodiment 2, mainly focusing on the enable function different from Embodiment 1.

Bias circuit 220 is capable of changing bias voltage VBIAS according to an EN terminal voltage of power amplifier device 200, to switch an operation of first transistor 101 between an active state (ON state) and an inactive state (OFF state). When a high-level voltage, for example, 3.3 V is applied to the EN terminal, an output of inverter circuit 265 becomes a low level, an output of inverter circuit 266 becomes a high level, and second power supply voltage VBB is applied to the gate of p-type MOSFET 267. p-type MOSFET 267 is normally OFF and non-conductive. Accordingly, when the high-level voltage is applied to the EN terminal, first transistor 101 and second transistor 121 are in the ON-state and operate in the same manner as bias circuit 120 according to Embodiment 1.

In contrast, when a low-level voltage, for example, 0 V is applied to the EN terminal, an output of inverter circuit 265 becomes a high level, an output of inverter circuit 266 becomes a low level, and the gate of p-type MOSFET 267 becomes a low level. When p-type MOSFET 267 becomes conductive, reference voltage Vref rises to the vicinity of second power supply voltage VBB. When a collector current of PNP transistor 162 sufficiently decreases, bias voltage VBIAS drops to the vicinity of third power supply voltage VGG, and first transistor 101 and second transistor 121 enter the OFF state. Accordingly, when the low-level voltage is applied to the EN terminal, power amplifier device 200 enters the OFF state, and the power consumption is significantly reduced compared to a case in which an RF input signal is in a no-signal state.

As stated above, as with Embodiment 1, since the power amplifier device according to Embodiment 2 includes the bias circuit capable of reducing a variation in drain current due to a manufacturing variation or temperature dependency of first transistor 101 for power amplification, and is further capable of reducing a supply voltage to the bias circuit, it is possible to achieve a circuit configuration capable of power consumption reduction and cost reduction. Moreover, it is possible to cause power amplifier device 200 to enter the OFF state when power amplification is unnecessary, making power consumption reduction possible. Furthermore, it is possible to include the enable function by adding a small number of low-withstand-voltage elements, making it possible to suppress an increase in cost.

It should be noted that the enable function is also effective when a communication scheme such as time division duplex (TDD) switches between transmission and reception in the same frequency band on a per time basis. For example, in the case of an amplifier device for transmission, it is easy to perform the switching by changing an EN terminal voltage to a high level at the time of transmission and to a low level at the time of reception.

It should be noted that although an EN terminal voltage is caused to have no influence on reference voltage Vref when the EN terminal voltage is at a high level, by configuring the enable control portion of current sensing amplifier 260 using inverter circuits 265 and 266 and p-type MOSFET 267 in the present embodiment, the enable control portion may be configured using a PNP transistor etc. In addition, an EN terminal voltage may influence reference voltage Vref when the EN terminal voltage is at a high level.

It should be noted that although the enable function is achieved by indirectly changing bias voltage VBIAS by changing reference voltage Vref in the present embodiment, bias voltage VBIAS may be directly changed.

As described above, power amplifier device 200 according to Embodiment 2 includes an enable control terminal for controlling an active state and an inactive state of the bias voltage.

With this configuration, since the bias circuit can be formed of a low-withstand-voltage, general-purpose circuit element, it is possible to easily implement the enable function by the enable control terminal.

Embodiment 3

Next, a power amplifier system including a power amplifier device according to Embodiment 3 will be described with reference to FIG. 8A.

Embodiment 3 describes a power amplifier device including a bias circuit that senses a source current of a second transistor. It should be noted that description overlapping Embodiment 1 will be omitted.

Figure 8A:
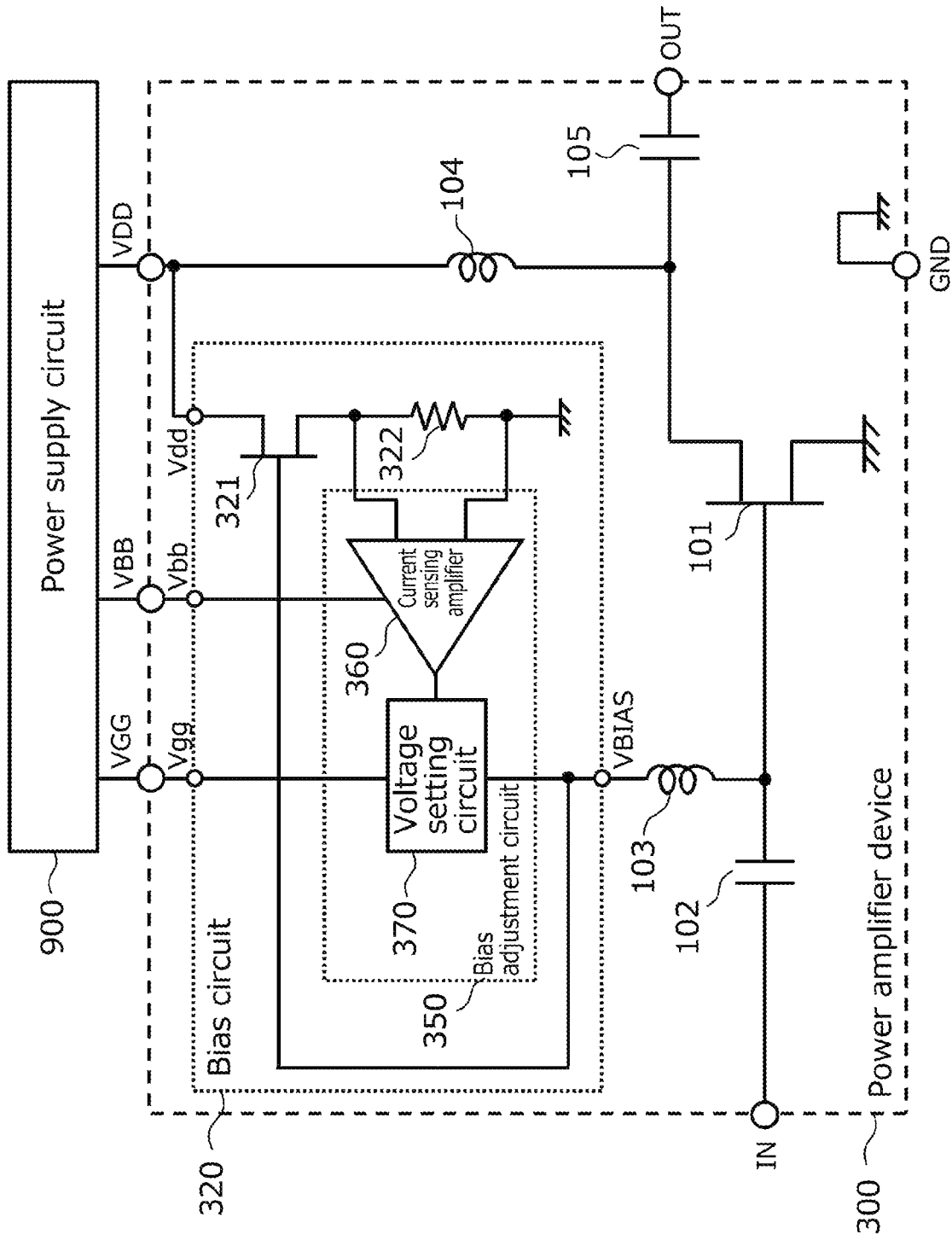
FIG. 8A is a circuit diagram illustrating one configuration example of a power amplifier system including a power amplifier device according to Embodiment 3.

FIG. 8A is a circuit diagram illustrating one configuration example of a power amplifier system including a power amplifier device according to Embodiment 3. The power amplifier system shown by FIG. 8A differs from the power amplifier system shown by FIG. 1A including the power amplifier device according to Embodiment 1 in including power amplifier device 300 instead of power amplifier device 100. The following mainly describes the differences. Power amplifier device 300 differs from power amplifier device 100 shown by FIG. 1A in including bias circuit 320 instead of bias circuit 120. Bias circuit 320 has a Vdd terminal, a Vbb terminal, a Vgg terminal, and a VBIAS terminal and includes, for example, second transistor 321, current sensing resistor 322, and bias adjustment circuit 350. Bias adjustment circuit 350 includes current sensing amplifier 360 and voltage setting circuit 370. Second transistor 321 is a transistor for monitoring a drain current of first transistor 101 for power amplification. Second transistor 321 differs from second transistor 121 shown by FIG. 1A in having the drain connected to the Vdd terminal and the source connected to current sensing resistor 322. Second transistor 321 has the source that is substantially grounded. Here, the term "substantially grounded" is not limited to mean that second transistor 321 is directly grounded, and is intended to mean that second transistor 321 has the source that is grounded via current sensing resistor 322. This is because a resistance value of current sensing resistor 322 is sufficiently small.

Figure 8B:
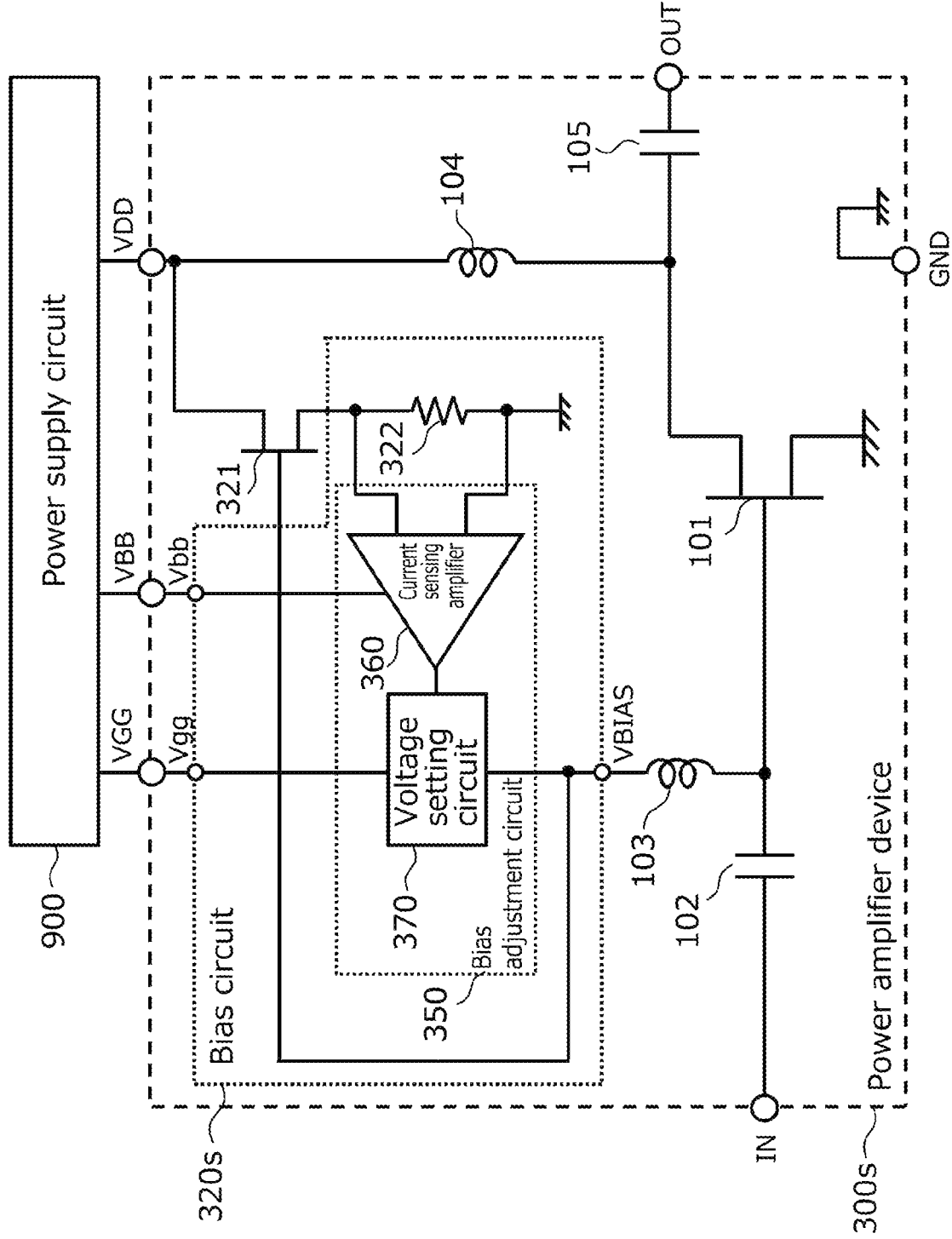
FIG. 8B is a circuit diagram illustrating another configuration example of a power amplifier system including a power amplifier device according to Embodiment 3.

It should be noted that second transistor 321 may be disposed outside bias circuit 320 in FIG. 8A. FIG. 8B shows a configuration example of this case. Power amplifier device 300s shown by FIG. 8B differs from power amplifier device 300 shown by FIG. 8A in that second transistor 321 is disposed not inside but outside bias circuit 320s. These power amplifier devices are identical except for this difference.

The following describes operations of the power amplifier device thus configured according to Embodiment 3, mainly focusing on bias circuit 320 different from Embodiment 1.

Power supply circuit 900 applies second power supply voltage VBB and third power supply voltage VGG to bias circuit 320. Second power supply voltage VBB is, for example, 3.3 V, and third power supply voltage VGG is, for example, −5 V. Same bias voltage VBIAS as first transistor 101 is applied to the gate of second transistor 321, and drain current Idq2 flows through the drain of second transistor 321. Here, when second transistor 321 is a transistor of HEMT type or an LDMOS transistor, since almost no current flows between the gate and the drain or the gate and the source, source current Isq2 is substantially equal to drain current Idq2. Since inductor 103 does not input an RF input signal to second transistor 321, source current Isq2 stays constant regardless of the RF input signal. Source current Isq2 is substantially proportional to idle current Idq1 of first transistor 101 and is, for example, 10 mA. It should be noted that the term "substantially proportional" means that drain currents and source currents of first transistor 101 and second transistor 321 have a substantially proportional relationship because (i) first transistor 101 and second transistor 321 are semiconductor devices, and (ii) it is rare that even if the same drain voltage and gate voltage are applied to first transistor 101 and second transistor 321, drain currents and source currents of first transistor 101 and second transistor 321 have a complete proportional relationship. For this reason, detecting source current Isq2 of second transistor 321 makes it possible to monitor idle current Idq1 of first transistor 101. Moreover, second transistor 321 may have the same device architecture as first transistor 101, be disposed on the same semiconductor substrate as first transistor 101, and be contained in one package so that second transistor 321 operates in conjunction with the variation in characteristics of first transistor 101 due to a manufacturing variation or temperature dependency.

Current sensing resistor 322 is a resistor for sensing source current Isq2 of second transistor 321 and has, for example, a resistance of 10Ω. For example, when source current Isq2 of 10 mA flows, a voltage between the both ends (detection voltage Vdetect) of current sensing resistor 322 is 0.1 V.

Current sensing amplifier 360 generates a signal according to detection voltage Vdetect and outputs the signal to voltage setting circuit 370.

Voltage setting circuit 370 generates bias voltage VBIAS from the signal inputted from current sensing amplifier 360 and third power supply voltage VGG. Voltage setting circuit 370 sets bias voltage VBIAS to be higher with a decrease in detection voltage Vdetect.

As stated above, when idle current Idq1 of first transistor 101 decreases due to, for example, a change in temperature, source current Isq2 of second transistor 321 in a substantially proportional relationship with first transistor 101 decreases. A decrease in detection voltage Vdetect leads to an increase in bias voltage VBIAS, and source current Isq2 of second transistor 321 increases. Idle current Idq1 of first transistor 101 in the substantially proportional relationship with second transistor 321 also increases. Consequently, bias circuit 320 is capable of operating to increase idle current Idq1 of first transistor 101 for power amplification when idle current Idq1 decreases to be less than a predetermined current value due to the manufacturing variation or the temperature dependency etc.

Contrary to the above description, when idle current Idq1 of first transistor 101 increases, detection voltage Vdetect rises. Accordingly, bias voltage VBIAS drops, and it is possible to decrease idle current Idq1 of first transistor 101. Consequently, bias circuit 320 is capable of controlling bias voltage VBIAS according to an increase or decrease in idle current Idq1 of first transistor 101 for power amplification, to keep idle current Idq1 constant.

As stated above, as with Embodiment 1, since power amplifier device 300 according to Embodiment 3 includes bias circuit 320 capable of reducing a variation in drain current due to a manufacturing variation or temperature dependency of first transistor 101 for power amplification, and is further capable of reducing a supply voltage to bias circuit 320, it is possible to achieve a circuit configuration capable of power consumption reduction and cost reduction. Moreover, first power supply voltage VDD is applied to the drain of second transistor 321 in the same manner as the drain of first transistor 101, and there is no characteristic difference due to drain voltage dependency. For this reason, it is possible to reduce a variation in drain current with higher accuracy. Furthermore, since there is no necessity to set a supply voltage to bias circuit 320 in consideration of the drain voltage dependency, it is possible to further decrease second power supply voltage VBB. In addition, since a low-voltage, high-precision amplifier can be used for current sensing amplifier 360, decreasing source current Isq2 by reducing the gate width of second transistor 321 makes it possible to reduce power consumption.

Figure 9:
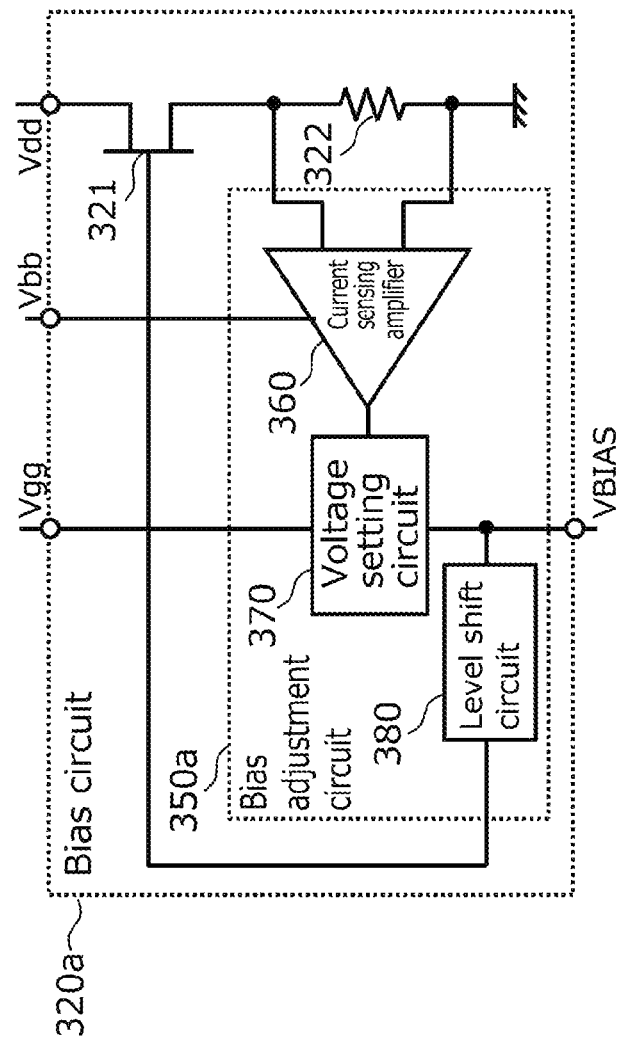
FIG. 9 is a circuit diagram illustrating a variation of a bias circuit according to Embodiment 3.

It should be noted that although bias circuit 320 that applies bias voltage VBIAS to the gate of second transistor 321 in the same manner as first transistor 101 has been described in the present embodiment, bias voltage VBIAS may be shifted and applied. For example, FIG. 9 shows bias circuit 320a including a level shift circuit. Bias circuit 320a includes level shift circuit 380 and applies a voltage obtained by shifting bias voltage VBIAS to the gate of second transistor 321. Level shift circuit 380 outputs, for example, a voltage obtained by adding 0.1 V to bias voltage VBIAS. To put it another way, the gate voltage of second transistor 321 is higher than the gate voltage of first transistor 101 by 0.1 V. On the other hand, since current sensing resistor 322 increases a source voltage of second transistor 321 by approximately 0.1 V, the gate-source voltage of second transistor 321 substantially matches the gate-source voltage of first transistor 101. Accordingly, level shift circuit 380 is capable of reducing the influence of current sensing resistor 322 on a gate-source voltage.

It should be noted that although second transistor 321 has the drain connected to the VDD terminal, and first power supply voltage VDD is applied to the drain in the same manner as first transistor 101 in the present embodiment, a voltage different from the voltage applied to first transistor 101, such as second power supply voltage VBB, may be applied to the drain.

As described above, power amplifier device 300 according to Embodiment 3 includes: a first power supply terminal for inputting first power supply voltage VDD; first transistor 101 for power amplification that includes a first drain supplied with power from the first power supply terminal, a first source that is grounded, and a first gate for inputting a radio-frequency signal; a second power supply terminal for inputting second power supply voltage VBB lower than first power supply voltage VDD; and bias circuit 320 that applies a bias voltage to the first gate of first transistor 101. Bias circuit 320 includes: second transistor 321 for monitoring that (i) includes a second drain supplied with power from the first power supply terminal or the second power supply terminal, a second source that is substantially grounded, and a second gate electrically connected to the first gate, and (ii) causes a source current to flow through the second source, the source current corresponding to a drain current of first transistor 101; and bias adjustment circuit 350 that is supplied with power from the second power supply terminal and adjusts the bias voltage according to the source current of second transistor 321.

With this configuration, it is possible to reduce the power consumption of bias circuit 320. In addition, it is possible to reduce costs because bias circuit 320 can be formed of a low-withstand-voltage, general-purpose, low-cost element.

Here, second transistor 321 may be supplied with the power from the first power supply terminal.

With this configuration, second transistor 321 for monitoring is capable of operating at the first power supply voltage in the same manner as first transistor 101, reducing the characteristic difference between second transistor 321 and first transistor 101, and improving the accuracy of monitoring, that is, the accuracy of imitating.

Embodiment 4

Next, a power amplifier device according to Embodiment 4 will be described with reference to FIG. 10.

Embodiment 4 describes a Doherty power amplifier device including transistors for power amplification. It should be noted that description overlapping Embodiment 1 will be omitted.

Figure 10:
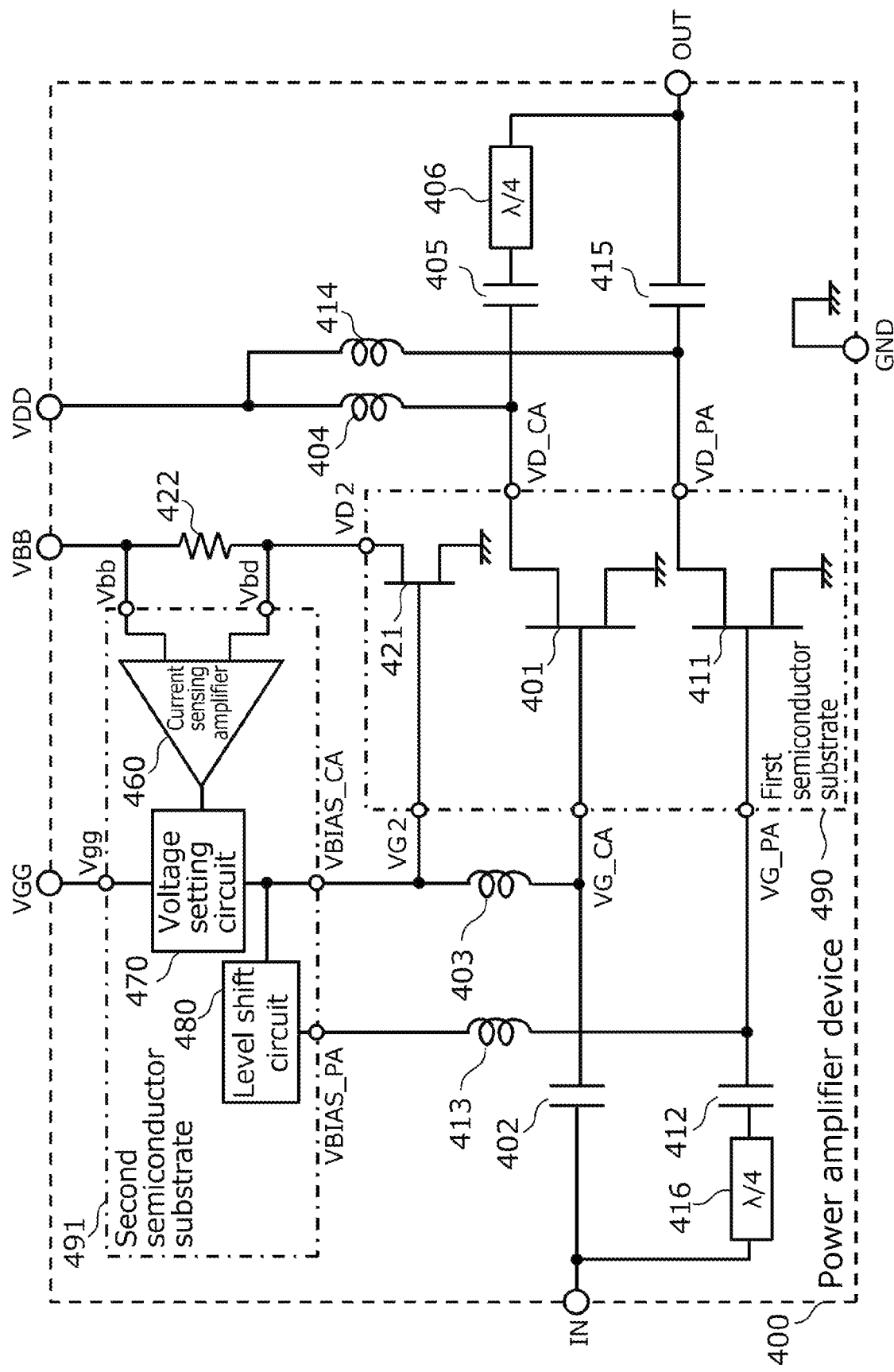
FIG. 10 is a circuit diagram illustrating one configuration of a power amplifier device according to Embodiment 4.

FIG. 10 is a circuit diagram illustrating one configuration of a power amplifier device according to Embodiment 4. Power amplifier device 400 shown by FIG. 10 differs from power amplifier device 100t according to Embodiment 1 shown by FIG. 3 in including transistors for power amplification etc. The following mainly describes the differences.

Power amplifier device 400 has an IN terminal, an OUT terminal, a VDD terminal, a VBB terminal, a VGG terminal, and a GND terminal and includes, for example, first semiconductor substrate 490, second semiconductor substrate 491, current sensing resistor 422, and quarter-wavelength phase lines 406 and 416. Some of elements (a transistor for monitoring a drain current of a transistor for power amplification, a current sensing resistor, a bias adjustment circuit) constituting a bias circuit are separately disposed on first semiconductor substrate 490 and second semiconductor substrate 491. Moreover, first semiconductor substrate 490 and second semiconductor substrate 491, together with current sensing resistor 422, capacitors 402, 405, 412, and 415, inductors 403, 404, 413, and 414, quarter-wavelength phase lines 406 and 416, are mounted on a submount substrate such as a multi-layer resin substrate to form power amplifier device 400.

First semiconductor substrate 490 has a VG_CA terminal, a VG_PA terminal, a VG2 terminal, a VD_CA terminal, a VD_PA terminal, a VD2 terminal, and first transistor 401, second transistor 421, and third transistor 411 are disposed on first semiconductor substrate 490. First transistor 401 has, for example, gate width Wg1 of 3 mm. Second transistor 421 has, for example, gate width Wg2 of 0.4 mm. Third transistor 411 has, for example, gate width Wg3 of 4.8 mm. These transistors have the same device architecture.

Second semiconductor substrate 491 has a Vbb terminal, a Vbd terminal, a Vgg terminal, a VBIAS_CA terminal, and a VBIAS_PA terminal. Current sensing amplifier 460, voltage setting circuit 470, and level shift circuit 480 are disposed on second semiconductor substrate 491 to form a bias adjustment circuit.

The connection of the above-described constituent elements as shown by FIG. 10 allows power amplifier device 400 to form a Doherty amplifier device including first transistor 401 as a carrier amplifier and third transistor 411 as a peak amplifier.

The IN terminal is connected to the gate of first transistor 401 via capacitor 402 and connected to the gate of third transistor 411 via quarter-wavelength phase line 416 and capacitor 412.

The OUT terminal is connected to the drain of first transistor 401 via quarter-wavelength phase line 406 and capacitor 405 and connected to the drain of third transistor 411 via capacitor 415.

First transistor 401 performs, for example, class A or class AB operation and always amplifies an RF input signal inputted from the IN terminal. In contrast, third transistor 411 performs, for example, class C operation and amplifies an RF input signal when the RF input signal has at least predetermined power.

The following describes operations of the power amplifier device thus configured according to Embodiment 4, mainly focusing on the differences from Embodiment 1.

Second transistor 421, current sensing resistor 422, current sensing amplifier 460, and voltage setting circuit 470 constitute a bias circuit equivalent to bias circuit 120 shown by FIG. 1A, and the bias circuit generates CA bias voltage VBIAS_CA equivalent to bias voltage VBIAS shown by FIG. 1A. CA bias voltage VBIAS_CA is, for example, approximately −2.5 V. CA bias voltage VBIAS_CA is applied to the gates of first transistor 401 and second transistor 421. Accordingly, as with Embodiment 1, by monitoring idle current Idq1 of first transistor 401 and adjusting CA bias voltage VBIAS_CA, it is possible to reduce a variation in idle current Idq1 due to a manufacturing variation or temperature dependency and to cause the power amplifier device to perform a predetermined class operation.

PA bias voltage VBIAS_PA to which CA bias voltage VBIAS_CA is shifted by level shift circuit 480 is applied to the gate of third transistor 411. PA bias voltage VBIAS_PA is, for example, approximately −3.5 V. Accordingly, third transistor 411 is gate-biased at PA bias voltage VBIAS_PA linked to CA bias voltage VBIAS_CA and is allowed to perform a predetermined class operation. Since third transistor 411 is disposed on same first semiconductor substrate 490 as first transistor 401, as with first transistor 401, third transistor 411 is capable of reducing a variation in characteristics due to the manufacturing variation or the temperature dependency.

As stated above, as with Embodiment 1, since power amplifier device 400 according to Embodiment 4 includes the bias circuit capable of reducing a variation in drain current due to the manufacturing variation or temperature dependency of first transistor 401 for power amplification, and is further capable of reducing a supply voltage to the bias circuit, it is possible to achieve a circuit configuration capable of power consumption reduction and cost reduction. Moreover, even when a power amplifier device includes transistors for power amplifier as with power amplifier device 400 including first transistor 401 and third transistor 411, one bias adjustment circuit disposed on second semiconductor substrate 491 is capable of gate bias.

It should be noted that although the one bias adjustment circuit disposed on second semiconductor substrate 491 generates CA bias voltage VBIAS_CA and PA bias voltage VBIAS_PA in the present embodiment, two different bias adjustment circuits may generate CA bias voltage VBIAS_CA and PA bias voltage VBIAS_PA, respectively.

It should be noted that although first transistor 401, second transistor 421, and third transistor 411 are disposed on first semiconductor substrate 490 in the present embodiment, third transistor 411 may be disposed on another semiconductor substrate. In this case, third transistor 411 may be contained in one package. Moreover, second transistor 421 may be disposed adjacent to first transistor 401.

It should be noted that although the Doherty amplifier device has been described as the power amplifier device including the transistors for power amplification in the present embodiment, the power amplifier device may be a power amplifier device other than the Doherty amplifier device. For example, the power amplifier device may be a power amplifier device in which transistors for power amplification are connected in series, and a bias voltage generated by one bias adjustment circuit may be applied to the gates of at least two transistors among transistors for power amplification in each stage.

As described above, power amplifier device 400 according to Embodiment 4 includes a plurality of transistors for power amplification including first transistor 401, and the bias circuit applies the bias voltage to a gate of at least one of the plurality of transistors for power amplification.

With this configuration, one bias circuit is capable of adjusting a bias voltage for the transistors for power amplification.

Here, the bias circuit may generate different bias voltages for the plurality of transistors for power amplification.

With this configuration, one bias circuit is capable of supplying and adjusting different bias voltages for the transistors for power amplification.

The accompanying drawings and detailed description are provided above as embodiments in order to describe examples of the technique disclosed in the present application.

Therefore, the constituent elements described in the accompanying drawings and detailed description may include not only constituent element necessary for solving the problem but also constituent elements for illustrating the technique, which are not essential to solving the problem. For this reason, description of these non-essential constituent elements in the accompanying drawings and detailed description is not intended to acknowledged essentiality of these non-essential constituent elements.

It should be noted that the technique in the present disclosure is not limited to these examples, and can also be applied to embodiments in which modifications, replacements, additions, and omissions have been made. Moreover, forms obtained by making, to the embodiments, various modifications conceived by a person skilled in the art as well as forms realized by combining the constituent elements in the embodiments are included within the scope of the technique in the present disclosure, provided that these do not depart from the essence of the technique in the present disclosure.

INDUSTRIAL APPLICABILITY

Since the power amplifier devices described in the present disclosure each include a bias circuit capable of reducing a variation in drain current due to a manufacturing variation or temperature dependency of a transistor for power amplification, and are each capable of reducing a supply voltage to the bias circuit, it is possible to achieve a circuit configuration capable of power consumption reduction and cost reduction.

Moreover, the power amplifier devices described in the present disclosure can be used for, for example, power amplification systems for mobile phone base stations, satellite communication base stations, mobile phone terminals, and satellite communication terminals, radar transmitters, wireless power transmitters, microwave heating devices such as microwave ovens.

The invention claimed is:
1. A power amplifier device comprising:
a first power supply terminal for inputting a first power supply voltage;
a first transistor for power amplification that (i) includes a first gate to which a bias voltage is applied, and (ii) is supplied with power from the first power supply terminal;
a second power supply terminal for inputting a second power supply voltage lower than the first power supply voltage;
a second transistor for monitoring that (i) includes a second gate to which the bias voltage is applied, (ii) is supplied with power from the first power supply terminal or the second power supply terminal, and (iii) imitates an operation of the first transistor; and
a bias circuit that is supplied with power from the second power supply terminal and generates and adjusts the bias voltage according to a drain current or a source current of the second transistor.
2. The power amplifier device according to claim 1, wherein the second transistor is supplied with the power from the second power supply terminal.

3. The power amplifier device according to claim 1,
wherein the bias circuit generates and adjusts the bias voltage according to the source current of the second transistor.

4. A power amplifier device comprising:
a first power supply terminal for inputting a first power supply voltage;
a first transistor for power amplification that includes a first drain supplied with power from the first power supply terminal, a first source that is grounded, and a first gate for inputting a radio-frequency signal;
a second power supply terminal for inputting a second power supply voltage lower than the first power supply voltage; and
a bias circuit that applies a bias voltage to the first gate of the first transistor,
wherein the bias circuit includes:
a second transistor for monitoring that (i) includes a second drain supplied with power from the second power supply terminal, a second source that is grounded, and a second gate electrically connected to the first gate, and (ii) causes a second drain current to flow through the second drain, the second drain current corresponding to a first drain current flowing through the first drain; and
a bias adjustment circuit that is supplied with the power from the second power supply terminal and adjusts the bias voltage according to the second drain current.

5. The power amplifier device according to claim 2,
wherein the second power supply voltage is set to a voltage at which the second transistor operates in a saturation region.

6. A power amplifier device comprising:
a first power supply terminal for inputting a first power supply voltage;
a first transistor for power amplification that includes a first drain supplied with power from the first power supply terminal, a first source that is grounded, and a first gate for inputting a radio-frequency signal;
a second power supply terminal for inputting a second power supply voltage lower than the first power supply voltage; and
a bias circuit that applies a bias voltage to the first gate of the first transistor,
wherein the bias circuit includes:
a second transistor for monitoring that (i) includes a second drain supplied with power from the first power supply terminal or the second power supply terminal, a second source that is substantially grounded, and a second gate electrically connected to the first gate, and (ii) causes a source current to flow through the second source, the source current corresponding to a drain current of the first transistor; and
a bias adjustment circuit that is supplied with power from the second power supply terminal and adjusts the bias voltage according to the source current of the second transistor.

7. The power amplifier device according to claim 1,
wherein the second transistor is supplied with the power from the first power supply terminal.

8. The power amplifier device according to claim 1,
wherein the second transistor is contained in a same package as the first transistor.

9. The power amplifier device according to claim 1,
wherein the second transistor is disposed on a same first semiconductor substrate as the first transistor.

10. The power amplifier device according to claim 1,
wherein at least part of the bias circuit is disposed on a different semiconductor substrate from the second transistor.

11. The power amplifier device according to claim 10, comprising:
a current sensing resistor connected to a drain or a source of the second transistor; and
a submount substrate on which the semiconductor substrate is mounted,
wherein the current sensing resistor is mounted on the submount substrate.

12. The power amplifier device according to claim 1, comprising:
an enable control terminal for controlling an active state and an inactive state of the bias voltage.

13. The power amplifier device according to claim 1,
wherein the first transistor and the second transistor are each a nitride semiconductor device.

14. The power amplifier device according to claim 1,
wherein the first transistor and the second transistor are each a laterally-diffused metal-oxide semiconductor (LDMOS) transistor.

15. The power amplifier device according to claim 1, comprising:
a plurality of transistors for power amplification including the first transistor,
wherein the bias circuit applies the bias voltage to a gate of at least one of the plurality of transistors for power amplification.

16. The power amplifier device according to claim 15,
wherein the bias circuit generates different bias voltages for the plurality of transistors for power amplification.

17. The power amplifier device according to claim 2,
wherein the bias circuit generates and adjusts the bias voltage according to the source current of the second transistor.

18. The power amplifier device according to claim 4,
wherein the second power supply voltage is set to a voltage at which the second transistor operates in a saturation region.

19. The power amplifier device according to claim 6,
wherein the second transistor is supplied with the power from the first power supply terminal.

* * * * *